(12) United States Patent
Hoefler

(10) Patent No.: US 7,678,620 B2
(45) Date of Patent: Mar. 16, 2010

(54) ANTIFUSE ONE TIME PROGRAMMABLE MEMORY ARRAY AND METHOD OF MANUFACTURE

(75) Inventor: Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 289 days.

(21) Appl. No.: 11/538,862

(22) Filed: Oct. 5, 2006

(65) Prior Publication Data

US 2008/0085574 A1 Apr. 10, 2008

(51) Int. Cl.
*H01L 21/82* (2006.01)

(52) U.S. Cl. ............... 438/131; 257/530; 257/E23.147

(58) Field of Classification Search .............. 438/131, 438/600, 530
See application file for complete search history.

(56) References Cited

U.S. PATENT DOCUMENTS

| | | | |
|---|---|---|---|
| 5,543,344 A * | 8/1996 | Hsu et al. ............. | 438/292 |
| 5,825,686 A | 10/1998 | Schmitt-Landsiedel et al. | |
| 6,420,215 B1 | 7/2002 | Knall et al. | |
| 6,483,736 B2 | 11/2002 | Johnson et al. | |
| 6,515,344 B1 | 2/2003 | Wollesen | |
| 6,515,888 B2 | 2/2003 | Johnson et al. | |
| 6,525,953 B1 | 2/2003 | Johnson | |
| 6,667,902 B2 | 12/2003 | Peng | |
| 6,671,040 B2 | 12/2003 | Fong et al. | |
| 6,747,896 B2 | 6/2004 | Wong | |
| 6,937,521 B2 | 8/2005 | Avni et al. | |
| 7,179,712 B2 | 2/2007 | Hoefler | |
| 7,314,815 B2 * | 1/2008 | Ho et al. ............. | 438/597 |
| 7,444,567 B2 | 10/2008 | Hoefler et al. | |
| 2003/0026158 A1 | 2/2003 | Knall et al. | |
| 2004/0190335 A1 | 9/2004 | Pascucci | |
| 2005/0145983 A1 | 7/2005 | Bertin et al. | |
| 2005/0167787 A1 | 8/2005 | Fricke et al. | |
| 2006/0054952 A1 | 3/2006 | Schoellkopf et al. | |
| 2006/0131613 A1 * | 6/2006 | Kim et al. ............. | 257/208 |

OTHER PUBLICATIONS

U.S. Appl. No. 11/197,814, filed Aug. 5, 2005.
U.S. Appl. No. 10/891,649, filed Jul. 15, 2004.
U.S. Appl. No. 10/640,723, filed Aug. 14, 2003.

(Continued)

*Primary Examiner*—Ha Tran T Nguyen
*Assistant Examiner*—Valerie Brown
(74) *Attorney, Agent, or Firm*—Robert L. King; Joanna G. Chiu

(57) ABSTRACT

A method for making a one time programmable (OTP) memory array includes providing a wafer comprising a buried insulator layer and a semiconductor layer over the buried insulator layer and forming a plurality of bit lines in the semiconductor layer. Each of the plurality of bit lines comprise a portion of the semiconductor layer and the plurality of bit lines are separated from each other by isolation regions formed in the semiconductor layer. The method further includes forming an anti-fuse dielectric layer over and in physical contact with the plurality of bit lines and the isolation regions, and forming a plurality of word lines over and in physical contact with the anti-fuse dielectric layer.

20 Claims, 4 Drawing Sheets

OTHER PUBLICATIONS

Johnson, Mark et al.; "512-Mb Prom With a Three-Dimensional Array of Diode/Antifuse Memory Cells"; IEEE Journal of Solid-State Circuits; Nov. 2003; pp. 1920-1928; vol. 38, No. 11; IEEE.

De Graaf; C. et al.; "A Novel High-Density Low-Cost Diode Programmable Read Only Memory"; IEDM 96-189; 1996; pp. 7.6.1-7.6.4; IEEE.

International Search Report and Written Opinion on PCT/US06/29704, Foreign Counterpart to Related U.S. Appl. No. 11/197,814 (US Patent 7206214).

Rejection on Related U.S. Appl. No. 11/197,814 (US Patent 7206214) mailed Sep. 19, 2006.

* cited by examiner

ANTIFUSE ONE TIME PROGRAMMABLE
MEMORY ARRAY AND METHOD OF
MANUFACTURE

RELATED APPLICATION

The present application is related to my copending U.S. patent application Ser. No. 11/197,814 entitled "One Time Programmable Memory And Method Of Operation" filed by Alexander Hoefler et al. and assigned to the assignee of this application.

FIELD OF THE INVENTION

This invention relates generally to semiconductors, and more specifically, to semiconductor devices having information storage capability.

BACKGROUND OF THE INVENTION

One form of semiconductor memory is the one time programmable (OTP) memory. One form of an OTP memory is an antifuse. An antifuse functions oppositely to a fuse by initially being nonconductive. When programmed, the antifuse becomes conductive. To program an antifuse a dielectric layer such as an oxide is subjected to a high electric field to generate a tunneling current through the dielectric. The tunneling current leads to a phenomenon known as hard dielectric breakdown. After dielectric breakdown, a conductive path is formed through the dielectric and thereby makes the antifuse become conductive.

Others have implemented antifuses in arrays having rows and columns to function as a nonvolatile memory (NVM) after being programmed. This type of memory functions as a read only memory (ROM) because the programming is irreversible. A conventional ROM is manufactured with a mask and thus the programming of the ROM must occur prior to manufacturing. In contrast, an antifuse is electrically programmed after the manufacture of the circuit and thus provides significantly more flexibility to users.

Typically capacitor structures are used as the dielectric material of the antifuse. A capacitor and a select transistor are commonly required to implement a single bit of information storage. The select transistor is required to select its associated particular capacitor for either a program or a read operation. Isolation elements are required at the boundaries of each bit in order to isolate the bits from each other. Therefore the area per bit is inefficient. As electronic devices evolve, an OTP memory which is smaller in area per bit is desired.

Others have implemented OTP memory using a crosspoint array which reduces cell size by using complex manufacturing processing requiring trenches having a significant depth and thus being hard to manufacture. The process complexity associated with known OTP memories is a significant factor in the cost of such OTP memories.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
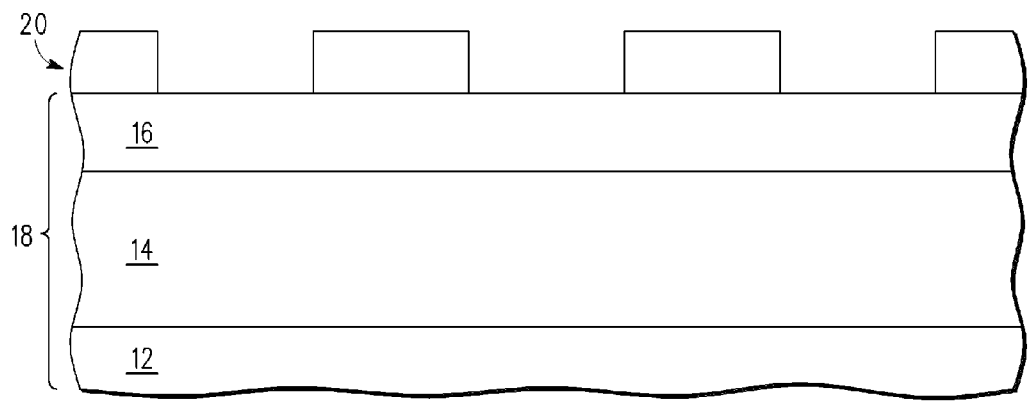
FIGS. 1-4 illustrate in cross-sectional form a one time programmable (OTP) memory array in accordance with one form of the present invention.

Illustrated in FIG. 1 is a one time programmable (OTP) memory array 10. A support substrate 12 is provided wherein the support substrate 12 may be any of a variety of supporting materials. The support substrate 12 may or may not be a semiconductor material but should be sufficiently rigid and strong to support a plurality of overlying layers without bending or fracturing. Overlying the support substrate 12 is a buried insulator 14. The buried insulator 14 in one form is a layer of oxide material. In such an embodiment the buried oxide material is often referred to as a buried oxide or BOX. Overlying and in physical contact with the buried insulator 14 is a semiconductor layer 16. In one form the semiconductor layer 16 is crystalline silicon and in particular monocrystalline silicon. However, it should be understood that various other semiconductor materials may be used for semiconductor layer 16. Examples include silicon, silicon germanium and other common semiconductor materials. The support substrate 12, the buried insulator 14 and the semiconductor layer 16 together form a semiconductor-on-insulator (SOI) wafer 18. It should be appreciated that the 501 wafer 18 may be purchased in the illustrated form, if desired, from commercial vendors prior to the subsequent processing steps that are described. Overlying the semiconductor layer 16 is a masking layer 20 having predetermined openings. In one form the masking layer 20 is implemented as a layer of photoresist material. The masking layer 20 is patterned pursuant to a design that identifies portions of the semiconductor layer 16 that will be removed by exposure of the semiconductor layer 16 to an etchant. The etchant creates openings (not shown) within semiconductor layer 16 that are then filled with an insulating or dielectric material such as silicon dioxide or other oxide materials. It should be understood that conventional planarizing techniques, such as chemical mechanical polishing (CMP), are used to form the planar layers that are illustrated herein.

Figure 2:
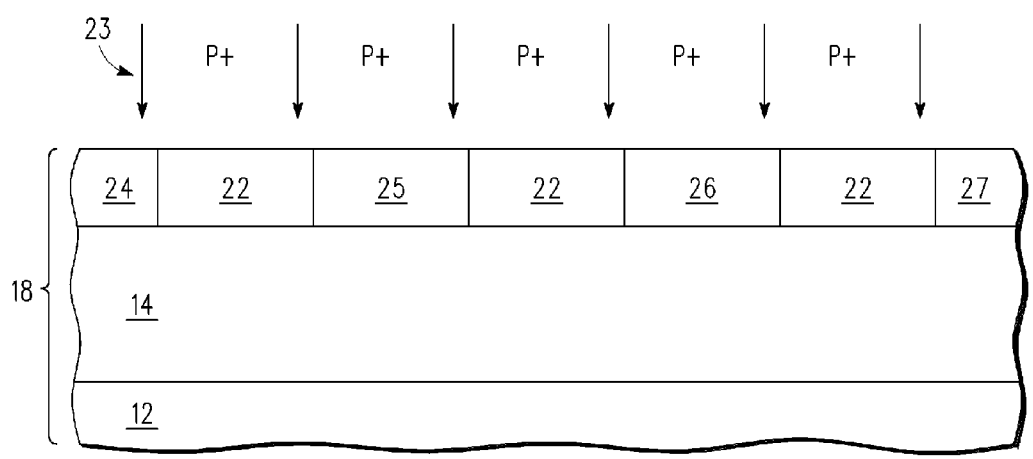

Illustrated in FIG. 2 is further processing of the OTP memory array 10. The OTP memory array 10 now has isolation regions 22 which are where the etched openings in semiconductor layer 16 were filled with a dielectric material. The isolation regions 22 separate remaining portions of the semiconductor layer 16 which were masked by the masking layer 20 and are in physical contact with the buried insulator 14. Each remaining portion of the semiconductor layer 16 becomes a bit line. In the illustrated form bit lines 24, 25, 26 and 27 are separated by the isolation regions 22. The OTP memory array 10 is exposed to a P+ implant 23. It should be understood that an N+ implant may be used in alternative forms. The P+ implant results in a P-type conductivity for the bit lines 24-27. A typical condition for P+ implant 23 could be a boron implant with a dose ranging from $1\times10^{13}$ cm$^{-2}$ to $1\times10^{14}$ cm$^{-2}$ and implant energy range from 10 keV to 40 keV.

Figure 3:
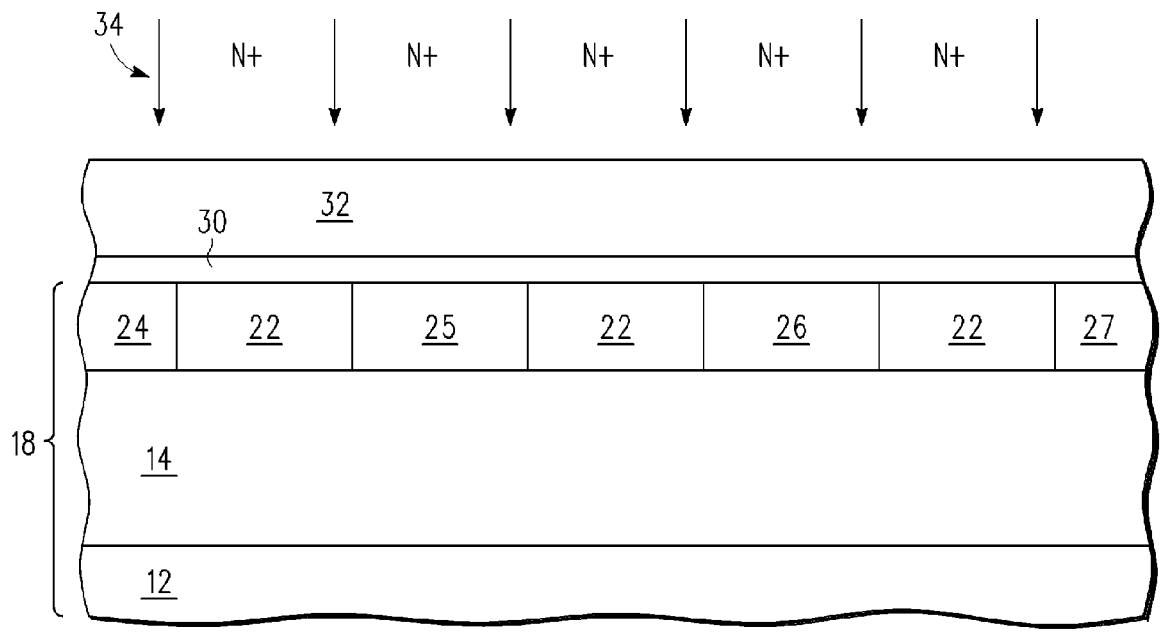

Illustrated in FIG. 3 is further processing of the OTP memory array 10. An antifuse dielectric 30 is formed overlying the bit lines 24-27 and separating isolation regions 22. In one form the antifuse dielectric 30 is formed of silicon dioxide or silicon nitride. Overlying the antifuse dielectric 30 is a conductive layer 32. Various conductive materials may be used for the conductive layer 32. In one form the conductive layer 32 is polysilicon. In another form other conductive semiconductor materials may be used. An N+ implant 34 is performed on the OTP memory array 10 to make the conductive layer 32 have an N-type conductivity. The conductivity of the implant 34 is chosen to be opposite the conductivity of the implant 23. If implant 23 is implemented as an N-type conductivity, then implant 34 would be implemented as a P-type conductivity. A typical condition for N+ implant 34 is a phosphorus implant with a dose ranging from $1 \times 10^{15}$ cm$^{-2}$ to $5 \times 10^{15}$ cm$^{-2}$ and an implant energy range from 10 keV to 40 keV. Regardless of the conductivity that is chosen, the conductive layer 32 in one form becomes a highly doped polysilicon layer. After the implant 34, the conductive layer 32 which overlies all of the OTP memory array 10 is patterned to form a plurality of word lines. The plurality of word lines is not discernable from the cross-sectional view of FIG. 3 but will be viewable as word lines 36 and 40 of FIG. 5 which will be described below. It should be understood that the order of patterning conductive layer 32 to form multiple word lines and the implanting of conductive layer 32 may be reversed. If these steps are reversed, then implant 34 functions to implant each of word lines 36 and 40 with other areas masked by a mask (not shown). The implant conditions chosen in that case would remain unchanged.

Figure 4:
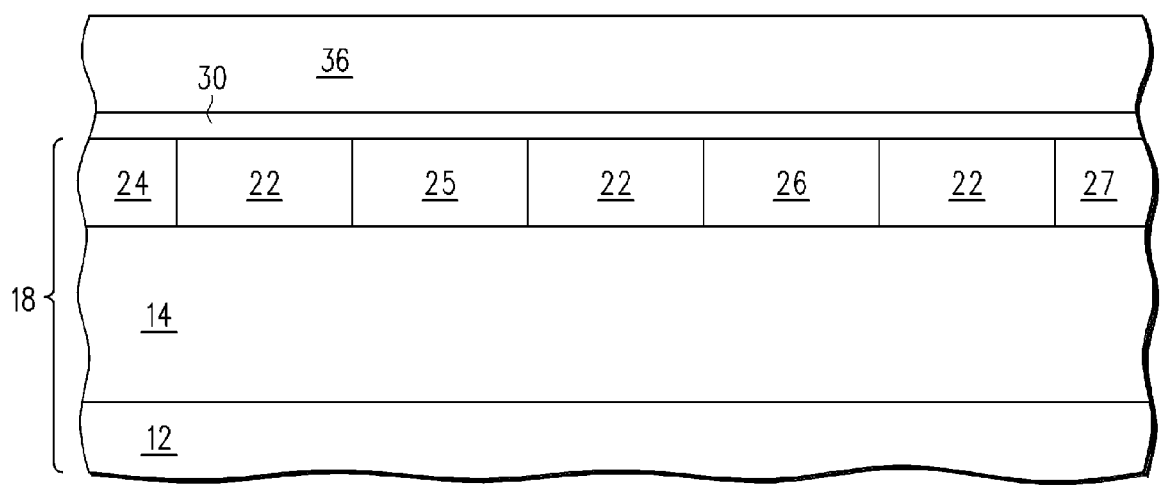

Illustrated in FIG. 4 is a cross-sectional view of OTP memory array 10 after the implant 34. A resulting word line 36 has an N-type conductivity. After the formation of word line 36, there has been provided a memory array 10 in which a single word line 36 overlies and intersects a plurality of bit line conductors in the form of bit lines 24-27.

In operation, the antifuse dielectric material electrically isolates word line 36 from each of the bit lines 24-27. Any one of the bit lines 24-27 is selected by select circuitry (not shown) by providing a program voltage $V_{PP}$ to the selected bit line. Similarly, any one of the word lines, such as word line 36 is selected by placing that word line at zero volts and keeping the other word lines at $V_{PP}$. In this manner a voltage differential is created at the intersection of the selected word line and selected bit line such that current is caused to flow into the antifuse dielectric 30 from the selected bit line to the selected word line. We can chose the programming voltage condition such that the current will cause a permanent dielectric breakdown in the antifuse dielectric 30 in the overlap region of the selected bit line and selected word line. As a result of this breakdown of the antifuse dielectric 30, there will be permanent electrical conduction between the previously selected bit line and the previously selected word line. This electrical conduction can be detected during a subsequent read operation by using sense circuits (not shown) to distinguish or sense programmed bits from unprogrammed bits.

Figure 5:
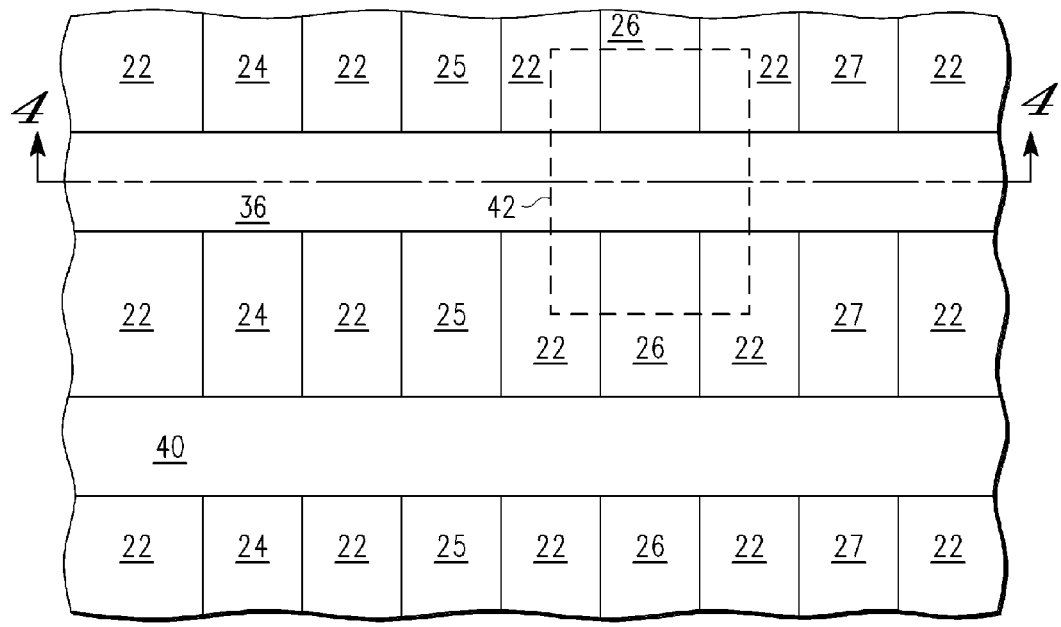
FIG. 5 illustrates in a top plan view one form of the OTP memory array of FIGS. 1-4.

Illustrated in FIG. 5 is a top plan view of the OTP memory array 10. Reference numbers that are common with FIGS. 1-4 are again used to correlate the top plan view with the cross-sectional views. The word line 36 overlies and intersects the bit lines 24-27 which are respectively separated by isolation regions 22. In the illustrated form the word line 36 is substantially perpendicular in an overlying plane to the bit lines 24-27. Parallel to and laterally separated from word line 36 is an adjacent word line 40. The word line 40 overlies and intersects the bit lines 24-27 in the same way that word line 36 does. For correlation purposes, the cross-sectional cut represented by FIG. 4 is indicated by line 4-4 of FIG. 5. In the illustrated form a memory cell 42 is represented by a dashed line to indicate an entire unit storage cell. The unit storage cell contains a bit line and intersecting word line of opposite conductivity type, along with an intervening antifuse dielectric. The unit storage cell thus forms a memory cell that can be electrically programmed once after the manufacture of the circuit. It should be readily noted that the OTP memory array 10 is very compact and modular. The OTP memory array 10 may thus be efficiently embedded within various portions of an integrated circuit design.

Figure 6:
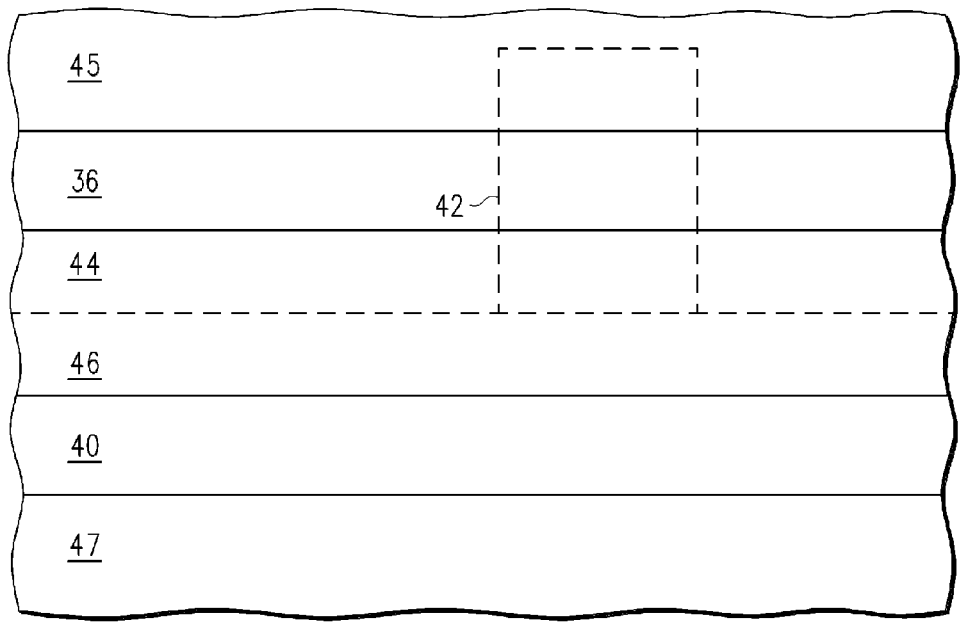
FIG. 6 illustrates in a top plan view another form of the OTP memory array of FIGS. 1-4.

Illustrated in FIG. 6 is a plan view of the OTP memory array 10 in which sidewall spacers 44-47 are formed adjacent the word lines 36 and 40. In particular, sidewall spacers 44 and 45 are formed adjacent opposite sides of the word line 36. Sidewall spacers 46 and 47 are formed adjacent opposite sides of the word line 40. It should be understood that in extended areas that are not illustrated in FIG. 6 that sidewall spacers 44 and 45 may join together and sidewall spacers 46 and 47 may join together. Instead of the isolation regions 22 and bit lines 24-27 being exposed, these regions are covered. The sidewall spacers may be formed with a width that is chosen so that there is no intervening gap between sidewall spacers 44 and 46. In other words sidewall spacers 44 and 46 become a continuous layer to completely cover the underlying bit lines 24-27 and isolation regions 22. For purposes of reference to FIG. 5, the memory cell 42 location is again identified.

In an alternate form to FIGS. 3 and 4, the implantation of conductive layer 32 may be deferred until completion of the device as illustrated in FIG. 6. In this form the mask (not shown) that was used in the FIG. 3 processing to selectively implant conductive layer 32 is avoided because the overlapping sidewall spacers 44-47 of FIG. 6 will function as a mask. Therefore the word lines, such as word lines 36 and 40, may be implanted in FIG. 6 to provide the conductivity difference between the word lines and the bit lines.

Figure 7:
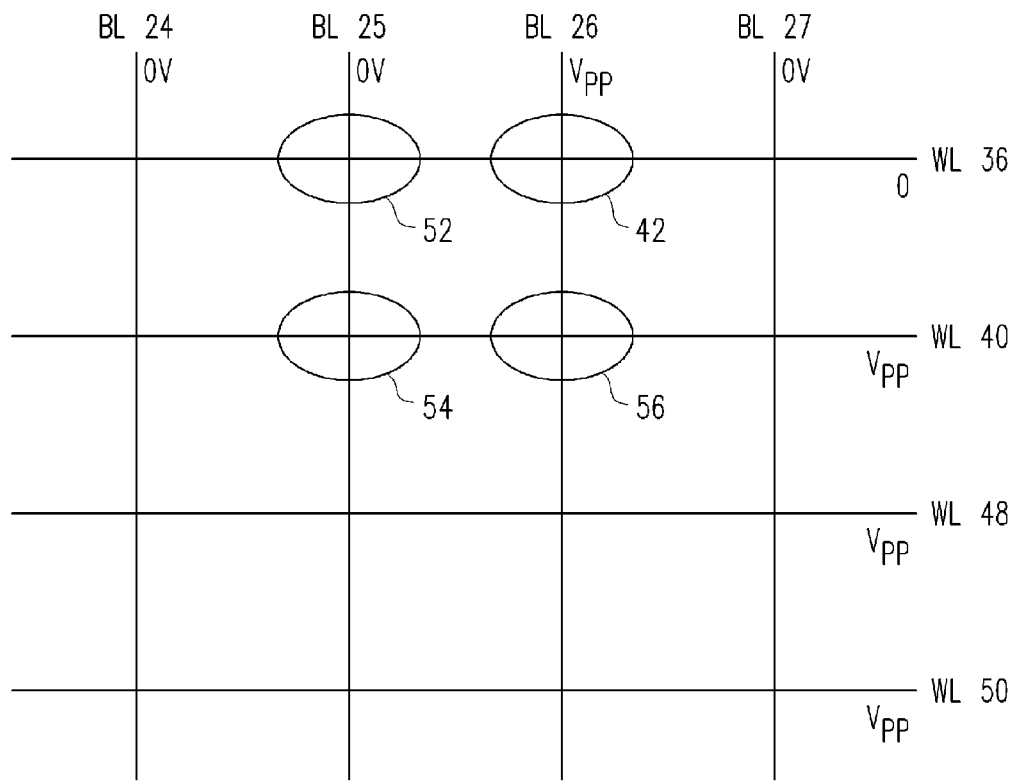
FIG. 7 illustrates in array layout form an exemplary memory array with exemplary programming voltages.

Illustrated in FIG. 7 is an array layout of the OTP memory array 10. The OTP memory array 10 has a plurality of intersecting word lines and bit lines. All of the word lines are parallel and all of the bit lines are parallel. For example, bit lines 24-27 are parallel and word lines 36, 40, 48 and 50 are parallel. For purposes of explanation, some exemplary operating voltages are illustrated. For example, assume that a programming voltage, $V_{PP}$, is connected to the bit line 26 and all other bit lines are held at zero volts. A bit line decoder and select circuit (not shown) functions to determine what bit line and when a programming voltage is applied. The value of $V_{PP}$ depends upon processing variables. In one form the voltage of $V_{PP}$ may be approximately in a range of two to six volts. Other voltages may be used depending upon the type of process used. At the same time that a programming voltage is applied to a selected bit line, the programming voltage $V_{PP}$ is applied to word lines 40, 48 and 50. Word line 36 is connected to zero volts. Due to a resulting strong electric field across the antifuse dielectric 30 at the overlap of bit line 26 and word line 36, there is current flowing from the N conductivity word line 36 to the P conductivity bit line 26. This current causes an irreversible dielectric breakdown in only the selected area of antifuse dielectric 30 and programs memory cell 42 to a state of conductivity.

Conversely for a memory cell 54 the polarity of the electric field across the antifuse dielectric 30 is reversed from that of memory cell 42. For this cell word line 40 is biased at the programming voltage $V_{PP}$ and bit line 25 is connected to zero volts. Due to the formation of depletion zones in the bit line and word line immediately adjacent to the antifuse dielectric 30 of memory cell 54, the electric field across the antifuse dielectric 30 is greatly reduced. Therefore, a dielectric breakdown will not occur.

For memory cell 52, there is no electric field across the antifuse dielectric 30. For this cell word line 36 is biased at zero and bit line 25 is connected to zero volts. Therefore, a dielectric breakdown will not occur.

For memory cell 56, there is no electric field across the antifuse dielectric 30. For this cell word line 40 is biased at $V_{PP}$ and bit line 26 is connected to $V_{PP}$ volts. Therefore, a dielectric breakdown will not occur.

By now it should be appreciated that there has been provided a high density (i.e. compact) antifuse one-time programmable storage array that is an improved alternative to conventional ROMs. The method of manufacture described herein may be implemented into a conventional semiconductor process as the disclosed structures do not require processing that results in a complex structure, such as trenches and/or wells of significant depth, or a large sized storage device. The processing required to implement the disclosed structures is readily adaptable to conventional processes and therefore is very cost effective to implement. By using an SOI substrate, the storage devices of the array are effectively isolated from other circuitry.

In the foregoing specification, the invention has been described with reference to specific embodiments. However, one of ordinary skill in the art appreciates that various modifications and changes can be made without departing from the scope of the present invention as set forth in the claims below. For example, various semiconductor materials and dielectric materials may be used. Various implant technologies may be implemented. Any of several planarization techniques may be used to ensure the planarity of the layers that are illustrated. Various masking techniques and masking materials may be used.

There is herein provided a method for making a one time programmable (OTP) memory array. A wafer is providing having a buried insulator layer and a semiconductor layer over the buried insulator layer. A plurality of bit lines is formed in the semiconductor layer, wherein each of the plurality of bit lines has a portion of the semiconductor layer and the plurality of bit lines are separated from each other by isolation regions formed in the semiconductor layer. An anti-fuse dielectric layer is formed over and in physical contact with the plurality of bit lines and the isolation regions. A plurality of word lines is formed over and in physical contact with the anti-fuse dielectric layer. In one form the plurality of bit lines are formed in the semiconductor layer of the SOI wafer by forming isolation trenches in the semiconductor layer. The isolation trenches are filled with an insulating material. An implant having a first conductivity type is implanted into the semiconductor layer prior to forming the isolation trenches. In another form the word lines are implanted with an implant having a second conductivity type, different from the first conductivity type. In another form an implant having a first conductivity type is implanted into the plurality of bit lines. In yet another form the word lines are implanted with an implant having a second conductivity type, different from the first conductivity type. In a further form the semiconductor layer is monocrystalline silicon. In a further form each of the plurality of word lines is polycrystalline silicon. In another form the plurality of word lines are formed by forming a conductive layer over and in physical contact with anti-fuse dielectric layer. The conductive layer is patterned to form the plurality of word lines. In a further form a sidewall spacer is formed adjacent each word line. In another form the plurality of word lines lie substantially perpendicular in reference to the plurality of bit lines and a unit cell of the OTP memory array is defined at each crossing of a word line of the plurality of word lines over a bit line of the plurality of bit lines.

In another form there is provided a method for making a one time programmable (OTP) memory array by providing a silicon-on-insulator (SOI) wafer. The SOI wafer has a support substrate, a buried oxide layer over the support substrate, and a monocrystalline silicon layer over the buried oxide layer. A plurality of isolation trenches are formed in the monocrystalline silicon layer of the SOI wafer and extend down to the buried oxide layer. The plurality of isolation trenches are filled with an isolation material to form a plurality of isolation regions in the monocrystalline silicon layer of the SOI wafer. Regions of the monocrystalline silicon layer of the SOI wafer remain between the isolation trenches and define a plurality of bit lines of the OTP memory array. An anti-fuse dielectric layer is formed over and directly contacts the plurality of bit lines and the isolation regions. A plurality of word lines is formed over and directly contacts the anti-fuse dielectric layer. The plurality of word lines lie substantially perpendicular in reference to the plurality of bit lines. A unit cell of the OTP memory array is defined at each crossing of a word line of the plurality of word lines over a bit line of the plurality of bit lines. In one form the plurality of word lines is formed over and directly contacts the anti-fuse dielectric layer by forming a conductive layer over and directly contacting the anti-fuse layer. The conductive layer is patterned to form the plurality of word lines. In another form the conductive layer is polycrystalline silicon. In yet another form the bit lines are doped with a p-type implant and the word lines are doped with an n-type implant. In yet another form the anti-fuse layer is a material selected from a group consisting of an oxide, a nitride, and amorphous silicon.

In another form there is provided a one time programmable (OTP) memory array. There is provided a support substrate and a buried insulator layer over the support substrate. A plurality of bit lines is over the buried insulator layer. The plurality of bit lines are separated from each other by isolation regions. An anti-fuse dielectric layer is over and in physical contact with the plurality of bit lines and the isolation regions. A plurality of word lines is over and in physical contact with the anti-fuse dielectric layer, wherein the plurality of word lines lie substantially perpendicular in reference to the plurality of bit lines. A unit cell of the OTP memory array is defined at each crossing of a word line of the plurality of word lines over a bit line of the plurality of bit lines. In one form the plurality of bit lines is formed of monocrystalline silicon. In another form the plurality of word lines is formed of polycrystalline silicon. In yet another form the bit lines are doped with an implant having a first conductivity type, and the word lines are doped with an implant having a second conductivity type, different from the first conductivity type.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method for making a one time programmable (OTP) memory array, the method comprising:
   providing a wafer comprising a buried insulator layer and a semiconductor layer on and in physical contact with the buried insulator layer;
   forming a plurality of bit lines in the semiconductor layer in physical contact with the buried insulator layer, wherein each of the plurality of bit lines comprise a portion of the semiconductor layer and the plurality of bit lines are separated from each other by isolation regions formed in the semiconductor layer and also in physical contact with the buried insulator layer;
   forming an anti-fuse dielectric layer over and in physical contact with the plurality of bit lines and the isolation regions; and
   forming a plurality of word lines over and in physical contact with the anti-fuse dielectric layer.

2. The method of claim 1, wherein forming the plurality of bit lines in the semiconductor layer comprises:
   forming isolation trenches in the semiconductor layer; and
   filling the isolation trenches with an insulating material.

3. The method of claim 2, further comprising implanting an implant having a first conductivity type into the semiconductor layer prior to forming the isolation trenches.

4. The method of claim 3, wherein the plurality of word lines are implanted with an implant having a second conductivity type, different from the first conductivity type.

5. The method of claim 1, further comprising implanting an implant having a first conductivity type into the plurality of bit lines.

6. The method of claim 5, wherein the plurality of word lines are implanted with an implant having a second conductivity type, different from the first conductivity type.

7. The method of claim 1, wherein the semiconductor layer comprises monocrystalline silicon.

8. The method of claim 1, wherein each of the plurality of word lines comprise polycrystalline silicon.

9. The method of claim 1, wherein forming the plurality of word lines comprises:
   forming a conductive layer over and in physical contact with anti-fuse dielectric layer; and
   patterning the conductive layer to form the plurality of word lines.

10. The method of claim 8, further comprising forming a sidewall spacer adjacent each word line.

11. The method of claim 1, wherein the plurality of word lines lie substantially perpendicular in reference to the plurality of bit lines and wherein a unit cell of the OTP memory array is defined at each crossing of a word line of the plurality of word lines over a bit line of the plurality of bit lines.

12. A method for making a one time programmable (OTP) memory array, the method comprising:
   providing a silicon-on-insulator (SOI) wafer, the SOI wafer comprising a support substrate, a buried oxide layer over and in physical contact with the support substrate, and a monocrystalline silicon layer over and in physical contact with the buried oxide layer;
   forming a plurality of isolation trenches in the monocrystalline silicon layer of the SOI wafer and extending down to the buried oxide layer;
   filling the plurality of isolation trenches with an isolation material that is in physical contact with the buried oxide layer to form a plurality of isolation regions in the monocrystalline silicon layer of the SOI wafer, wherein regions of the monocrystalline silicon layer of the SOI wafer remaining between the plurality of isolation trenches define a plurality of bit lines of the OTP memory array;
   forming an anti-fuse dielectric layer over and directly contacting the plurality of bit lines and the plurality of isolation regions; and
   forming a plurality of word lines over and directly contacting the anti-fuse dielectric layer, wherein the plurality of word lines lie substantially perpendicular in reference to the plurality of bit lines and wherein a unit cell of the OTP memory array is defined at each crossing of a word line of the plurality of word lines over a bit line of the plurality of bit lines.

13. The method of claim 12, wherein forming the plurality of word lines over and directly contacting the anti-fuse dielectric layer comprises:
   forming a conductive layer over and directly contacting the anti-fuse dielectric layer; and
   patterning the conductive layer to form the plurality of word lines.

14. The method of claim 13, wherein the conductive layer comprises polycrystalline silicon.

15. The method of claim 12, wherein the plurality of bit lines are doped with a p-type implant and the plurality of word lines are doped with an n-type implant.

16. The method of claim 12, wherein the anti-fuse dielectric layer comprises a material selected from a group consisting of an oxide, a nitride, and amorphous silicon.

17. A method for making a one time programmable (OTP) memory array, comprising:
   providing a support substrate;
   forming a buried insulator layer over and in physical contact with the support substrate;
   forming a plurality of bit lines over and in physical contact with the buried insulator layer, wherein the plurality of bit lines are separated from each other by isolation regions in physical contact with the buried insulator layer;
   forming an anti-fuse dielectric layer over and in physical contact with the plurality of bit lines and the isolation regions; and
   forming a plurality of word lines over and in physical contact with the anti-fuse dielectric layer, wherein the plurality of word lines lie substantially perpendicular in reference to the plurality of bit lines and wherein a unit cell of the OTP memory array is defined at each crossing of a word line of the plurality of word lines over a bit line of the plurality of bit lines.

18. The method of claim 17, further comprising:
forming the plurality of bit lines with monocrystalline silicon.

19. The method of claim 17, further comprising:
forming the plurality of word lines with polycrystalline silicon.

20. The method of claim 17, further comprising:
doping the plurality of bit lines with an implant having a first conductivity type; and
doping the plurality of word lines with an implant having a second conductivity type, different from the first conductivity type.

* * * * *